United States Patent [19]
Kim

[11] Patent Number: 6,067,132
[45] Date of Patent: May 23, 2000

[54] LCD HAVING CONTACT ELECTRODE COUPLING GATE ELECTRODE OF FIRST PIXEL TO REGION ACTIVE LAYER OF SECOND PIXEL REGION

[75] Inventor: Hong-Gyu Kim, Kyungki-do, Rep. of Korea

[73] Assignee: LG Electronics Inc., Rep. of Korea

[21] Appl. No.: 08/917,382

[22] Filed: Aug. 26, 1997

[30] Foreign Application Priority Data

Aug. 31, 1996 [KR] Rep. of Korea ............ 96-37539

[51] Int. Cl.[7] .................. G02F 1/136; H01L 29/04

[52] U.S. Cl. .................. 349/47; 349/43; 349/48; 349/38; 257/59

[58] Field of Search ............ 349/48, 43, 38, 349/47; 257/59, 72

[56] References Cited

U.S. PATENT DOCUMENTS

| | | | |
|---|---|---|---|
| 5,054,887 | 10/1991 | Kato et al. | 349/39 |
| 5,187,602 | 2/1993 | Ikeda et al. | 349/39 |
| 5,191,451 | 3/1993 | Katayama et al. | 349/48 |
| 5,212,574 | 5/1993 | Katayama et al. | 349/38 |
| 5,737,049 | 4/1998 | Shin et al. | 349/39 |
| 5,745,194 | 4/1998 | Nakashima et al. | 349/39 |
| 5,880,794 | 3/1999 | Hwang | 349/39 |

*Primary Examiner*—William L. Sikes
*Assistant Examiner*—Toan Ton
*Attorney, Agent, or Firm*—Fleshner & Kim, LLP

[57] ABSTRACT

Disclosed are a liquid crystal display device and a method for fabricating the same in which a storage capacitor has a transparent structure formed of an active layer, a gate insulating film, and a pixel electrode so that aperture can be improved. Since metal material having very low resistance is used as gate lines, the resistance of the gate lines is significantly reduced, thereby fabricating the liquid crystal display device having high density and high definition.

20 Claims, 10 Drawing Sheets

LCD HAVING CONTACT ELECTRODE COUPLING GATE ELECTRODE OF FIRST PIXEL TO REGION ACTIVE LAYER OF SECOND PIXEL REGION

BACKGROUND OF THE INVENTION

1. Field of the Invention

The present invention relates to a liquid crystal display device, and more particularly to a liquid crystal display device and a method of fabricating the same.

2. Background of the Related Art

Generally, a liquid crystal display device includes two glass plates, i.e., a bottom plate and a top plate, in which a liquid crystal is injected therebetween. A thin film transistor and a pixel electrode are arranged on the bottom plate. The top plate has a color filter layer for displaying a color, a common electrode, and a black matrix layer. A conventional liquid crystal display device will be described below with reference to the accompanying drawings.

FIG. 1 is a circuit diagram of a conventional liquid crystal display device. Referring to FIG. 1, a plurality of gate lines are disposed in one direction at a predetermined interval and a plurality of data lines are disposed perpendicular to the gate lines at a predetermined interval.

A plurality of thin film transistors are formed between the respective gate line and the respective data line in a matrix arrangement so as to apply signals of the data lines as well as the gate lines to the pixel electrode. A stacked storage capacitor and a liquid crystal capacitor having a liquid crystal layer as a dielectric are formed in the pixel electrode.

FIG. 2 is a layout illustrating a bottom plate of a conventional liquid crystal display device. FIGS. 3A–3H are sectional views illustrating fabricating process steps of a liquid crystal display device taken along I—I line of FIG. 2.

As illustrated in FIG. 3A, polysilicon is formed on a transparent insulating substrate 1 of glass or quartz and patterned to form an island shaped active layer 2. The active layer 2 serves as an active region of the thin film transistor and an electrode of the storage capacitor.

As illustrated in FIG. 3B, a photoresist 3 is coated on an entire surface of the substrate 1 and patterned to expose the active layer 2 which will be a lower electrode of the storage capacitor. Impurity ions such as phosphorus P or boron B are implanted into the exposed active layer 2 using the photoresist 3 as a mask.

Subsequently, as illustrated in FIG. 3C, the photoresist 3 is removed and a gate insulating film 4 is formed on the entire surface of the substrate 1 including the active layer 2. Polysilicon containing impurity ions is deposited on the entire surface of the substrate 1 including the gate insulating film 4. Silicide material such as WSix or MoSix is then deposited thereon and patterned to define gate electrodes 5 and 5' and upper electrodes 5a and 5a' of the storage capacitor. Here, the gate electrodes 5 and 5' are used as the gate line and the upper electrodes 5a and 5a' are used as the common electrode.

The impurity ions such as phosphorus or boron are implanted into the active layer 2 using the gate electrodes 5 and 5' as masks and the impurity ions are activated by heat treatment to define source and drain regions of the thin film transistor.

As illustrated in FIG. 3D, a first interlayer insulating film 6 is deposited on the entire surface of the substrate 1 including the gate electrodes 5 and 5'. A first contact hole 7 is formed by selectively removing the gate insulating film 4 and the first interlayer insulating film 6 to expose the source region of the active layer 2.

As illustrated in FIG. 3E, a metal is deposited on the entire surface of the substrate 1 including the first interlayer insulating film 6 and patterned so that a data line 8 is formed to be connected with the active layer 2 through the first contact hole 7.

As illustrated in FIG. 3F, a second interlayer insulating film 9 is deposited on the entire surface of the substrate 1 including the data line 8. A second contact hole 10 is formed by selectively removing the gate insulating film 4 and the first and second interlayer insulating films 6 and 9 to expose the drain region of the active layer 2.

As illustrated in FIG. 3G, a transparent conductive material such as Indium Tin Oxide (ITO) is deposited on the second interlayer insulating film 9 and patterned. A pixel electrode 11 is then formed to be connected with the active layer 2 through the second contact hole 10. The active layer 2 is hydrogenated to remove its defects.

As illustrated in FIG. 3H, a protective film 12 is formed on the entire surface of the substrate 1 including the pixel electrode 11 and a pad is open. As a result, the lower plate of the liquid crystal display device is completed.

As aforementioned, the conventional liquid crystal display device has several problems.

First, since the storage capacitor has an opaque stacked structure of the active layer, the gate insulating film, and the gate electrode, aperture ratio is reduced as much as an area 15–25% of the pixel region due to the storage capacitor.

Second, since the suicide material such as WSix or MoSix is deposited on the polysilicon containing the impurity ions to be used as the gate electrode material, there are problems in that the step of forming the suicide material is complicated and resistance becomes larger than that of the metal material.

Third, in the conventional liquid crystal display device, the photoresist is patterned on the active layer and the impurity ions are implanted into the active layer to define the lower electrode region of the storage capacitor. In this case, there are problems because the step of removing the photoresist is difficult and the surface of the active layer is damaged during that step of removing the photoresist, thereby deteriorating characteristics of the device.

Finally, for the case in which the silicide material such as WSix or MoSix is used as the gate electrode material, hydrogen ions are laterally-diffused through the gate insulating film instead of being diffused into the channel region through the gate electrode during the hydrogenation process. There results in problems that it takes much time during hydrogenation process and performance of the device is reduced.

The above references are incorporated by reference herein where appropriate for appropriate teachings of additional or alternative details, features and/or technical background.

SUMMARY OF THE INVENTION

Accordingly, the present invention is directed to a liquid crystal display device and a method for fabricating the same that substantially obviates one or more of the above problems, limitations and disadvantages of the related art.

An object of the present invention is to provide a liquid crystal display device and a method for fabricating the same, which improves aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device according to the present invention, having a plurality of matrix shaped pixel regions, and a plurality of gate lines and data lines perpendicular to each other between the pixel regions, includes a first active layer having source and drain regions in a first region on a substrate, a second active layer in a second region on the substrate, a gate electrode formed between the source region and drain regions of the first active layer in contact with the gate lines, a first pixel electrode formed in the pixel regions in contact with the drain region of the first active layer, and a contact electrode formed to be connected with the gate electrode in contact with the second active layer.

In another aspect, a method for fabricating a liquid crystal display device according to the present invention, having a thin film transistor and a storage capacitor, includes the steps of forming a first active layer in a thin film transistor region on a substrate, forming a second active layer in a storage capacitor region, forming a first insulating film on the first and second active layers, forming a gate electrode in the thin film transistor region, implanting impurity ions into the first active layer using the gate electrode as a mask to form source and drain regions of the thin film transistor, forming a first pixel electrode to be connected with the drain region of the first active layer, forming a contact electrode to be connected with the second active layer and the gate electrode, forming a second insulating film on an entire surface of the substrate including the first and pixel electrode the contact electrode, forming data lines to be connected with the source region of the first active layer, forming a third insulating film on the entire surface including the data lines, forming gate lines to be connected with the gate electrode, and forming a protective film on the entire surface of the substrate including the gate lines.

In other aspect, a liquid crystal display device according to the present invention, having a plurality of matrix shaped pixel regions, and a plurality of gate lines and data lines perpendicular to each other between the pixel regions, includes a first active layer having source and drain regions in a first region on a substrate, a second active layer in a second region on the substrate, a gate electrode formed between the source and drain regions of the first active layer in contact with gate lines, a first pixel electrode formed in the pixel regions in contact with the drain region of the first active layer, and a contact electrode formed in a data line region in contact with the second active layer.

In still another aspect, a method for fabricating a liquid crystal display device according to the present invention, having a thin film transistor and a storage capacitor, includes the steps of forming a first active layer in a thin film transistor region on a substrate, forming a second active layer in a storage capacitor region, forming a first insulating film on the first and second active layers, forming a gate electrode in the thin film transistor region, implanting impurity ions into the first active layer using the gate electrode as a mask to form source and drain regions of the thin film transistor, forming a first pixel electrode to be connected with the drain region of the first active layer, forming a contact electrode to be connected with a predetermined region of the second active layer, forming a second insulating film on an entire surface of the substrate including the first pixel electrode and the contact electrode electrodes, forming data lines in an integral form with the contact electrode to be connected with the source region of the first active layer, forming a third insulating film on the entire surface of the substrate including the data lines, forming gate lines to be connected with the gate electrode, and forming a protective film on the entire surface of the substrate including the gate lines.

It is to be understood that both the foregoing general description and the following detailed description are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements.

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a circuit diagram illustrating a conventional liquid crystal display device;

FIG. 2 is a layout illustrating a conventional liquid crystal display device;

FIGS. 3A–3H are sectional views illustrating fabricating process steps of a liquid crystal display device taken along I—I line of FIG. 2;

FIG. 4A is a circuit diagram illustrating a liquid crystal display device according to a first embodiment of the present invention;

FIG. 4B is a layout illustrating a liquid crystal display device according to the first embodiment of the present invention;

FIGS. 5A–5G are sectional views illustrating fabricating process steps of a liquid crystal display device taken along II—II line and III—III line of FIG. 4B;

FIG. 6 is a layout illustrating a liquid crystal display device according to a second embodiment of the present invention; and FIGS. 7A–7H are sectional views illustrating fabricating process steps of a liquid crystal display device taken along IV—IV line, V—V line, and VI—VI line of FIG. 6.

DETAILED DESCRIPTION OF PREFERRED EMBODIMENTS

Reference will now be made in detail to the preferred embodiments of the present invention, examples of which are illustrated in the accompanying drawings.

Figure 1:
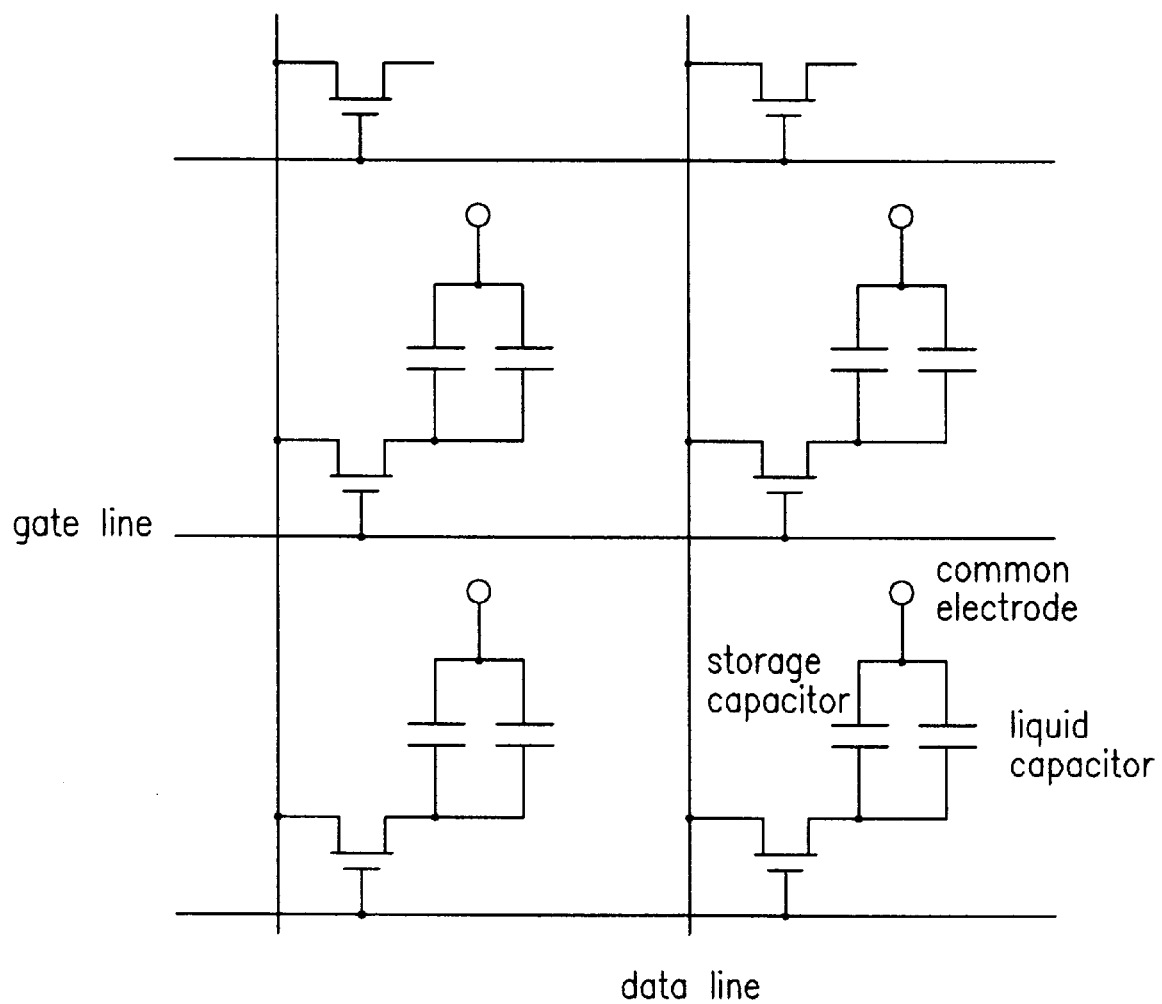
Figure 2:
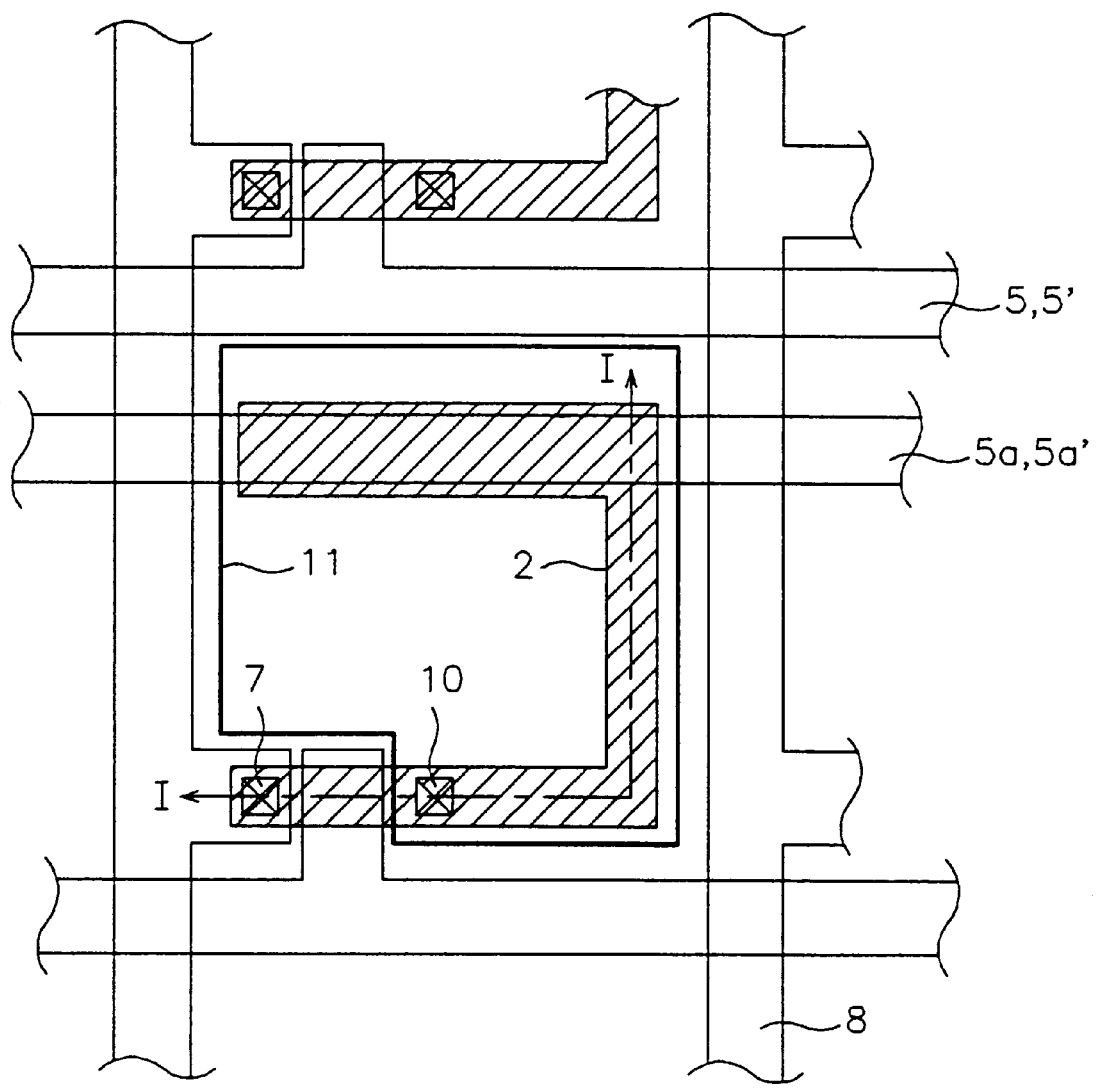
Figure 3A:
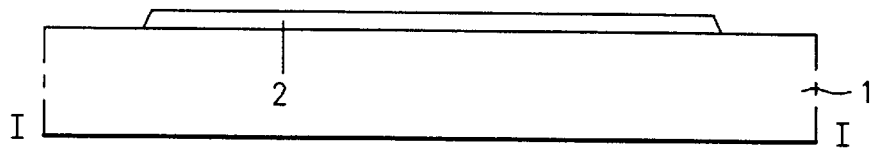
Figure 3B:
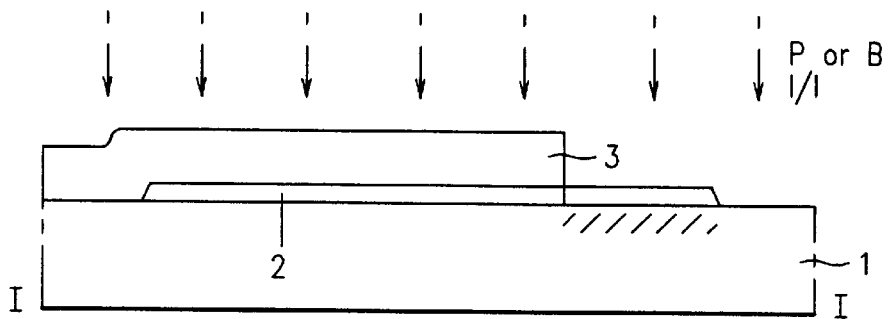
Figure 3C:
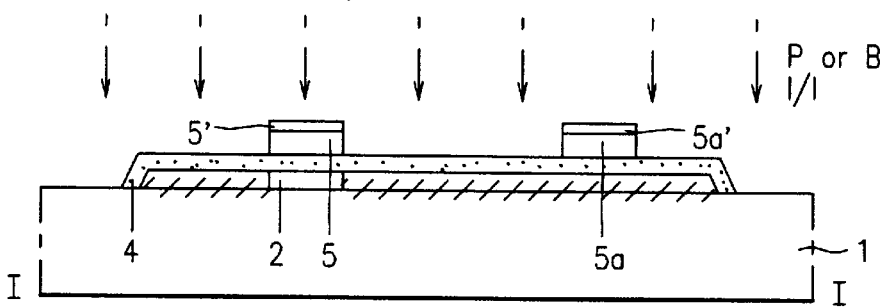
Figure 3D:
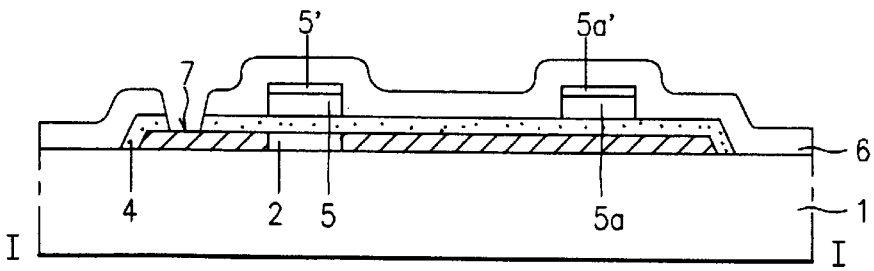
Figure 3E:
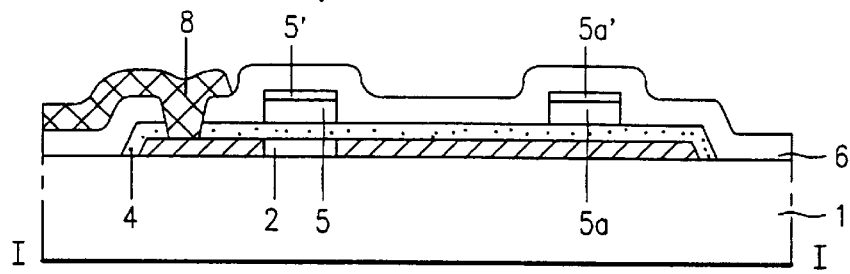
Figure 3F:
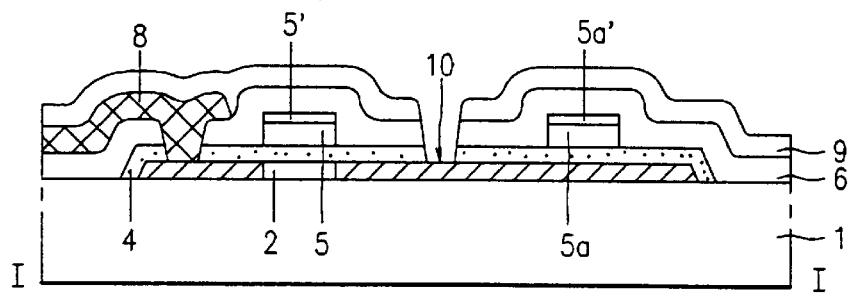
Figure 3G:
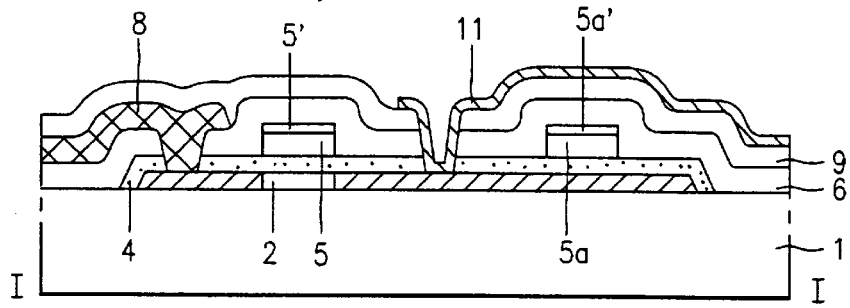
Figure 3H:
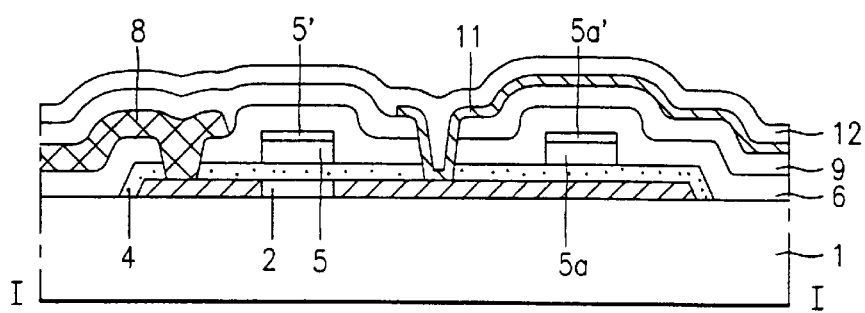
Figure 4A:
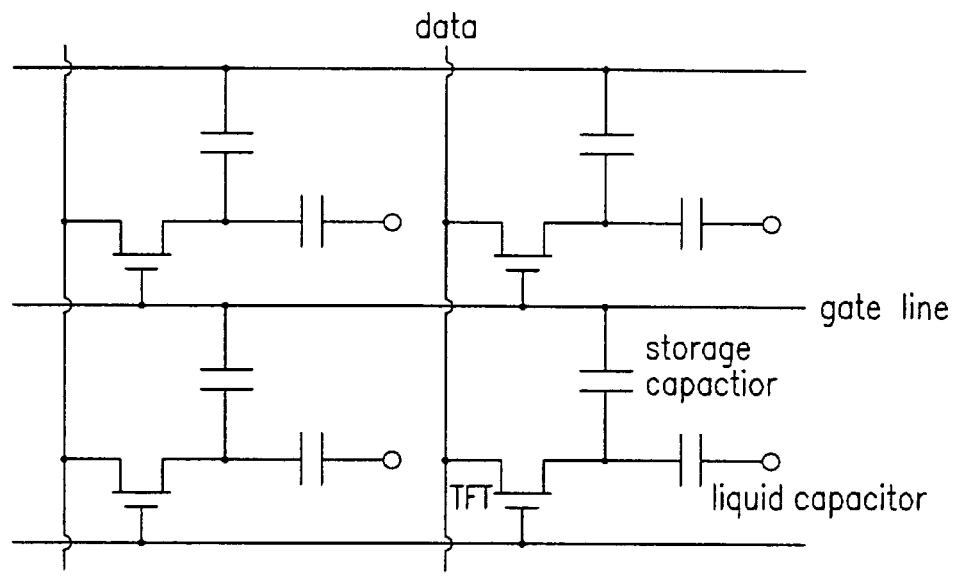
Figure 4B:
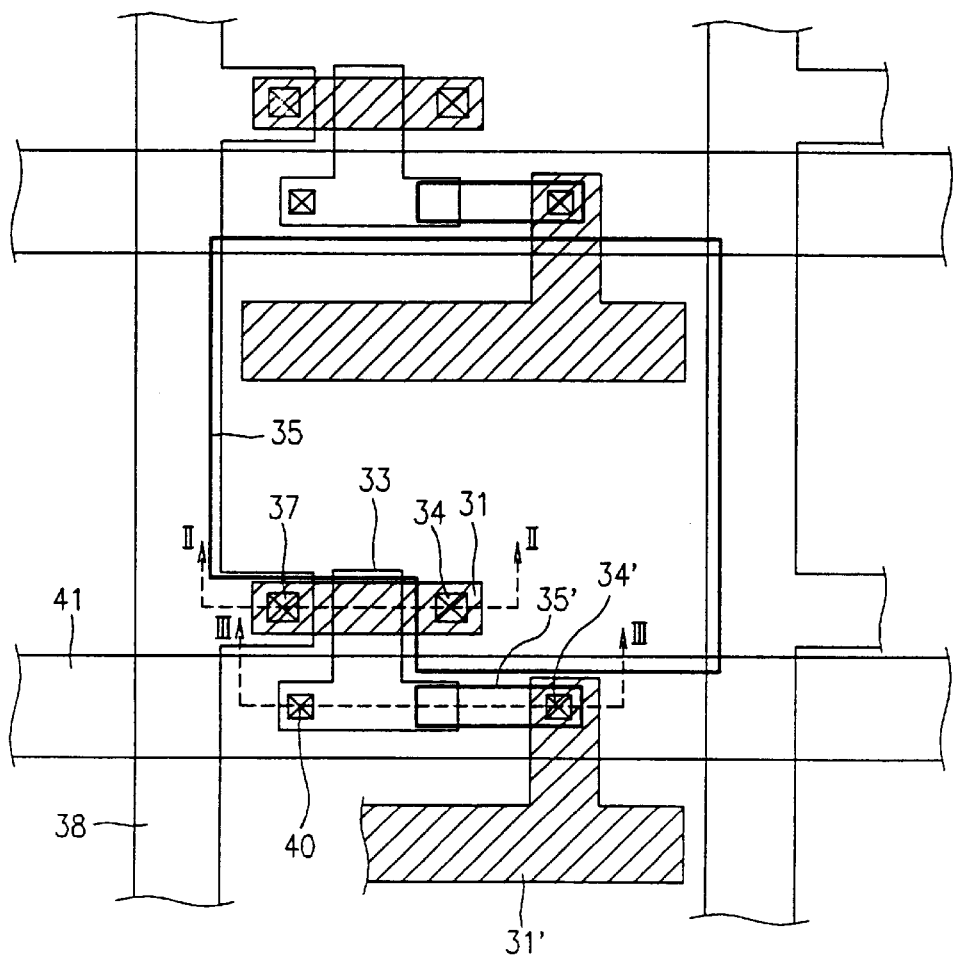

As illustrated in FIGS. 4A–4B, a plurality of gate lines 41 are formed at a predetermined interval and a plurality of data lines 38 are formed in a direction perpendicular to the gate lines 41 at a predetermined interval.

In a thin film transistor region on a substrate in which the gate lines 41 and the data lines 38 are formed, an island shaped first active layer 31 having source and drain regions is formed. In a storage capacitor region, an island shaped second active layer 31' is formed.

A gate electrode 33 is formed between the source and drain regions of the first active layer 31 in contact with the gate line 41. At this time, the gate electrode 33 and the gate line 41 are made of different material from each other.

A first pixel electrode 35 is formed in contact with the drain region of the first active layer 31. A contact electrode 35' is formed in contact with the second active layer 31' to be connected with the gate electrode 33.

The pixel electrode 35' is disposed below the gate line 41. The gate electrode 33 and the second active layer 31' in which the storage capacitor will be formed are connected to each other by the contact electrode 35'.

A method for fabricating the aforementioned liquid crystal display device according to the first embodiment of the present invention will be described below.

Figure 5A:
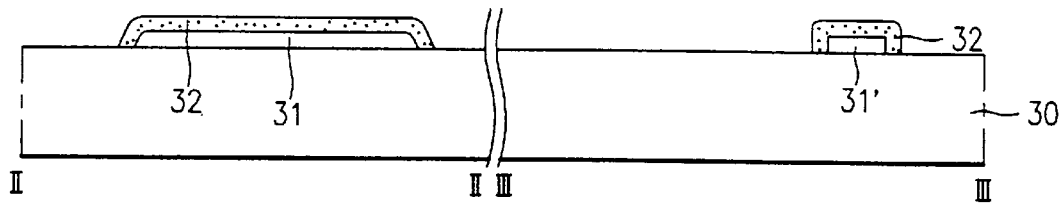

As illustrated in FIG. 5A, the first active layer 31 and the second active layer 31' are respectively formed in the thin film transistor region and the pixel region on a transparent insulating substrate 30 of glass or quartz and then patterned in island shapes. A gate insulating film 32 is formed on the entire surface on the first and second active layers 31 and 31'.

Figure 5B:
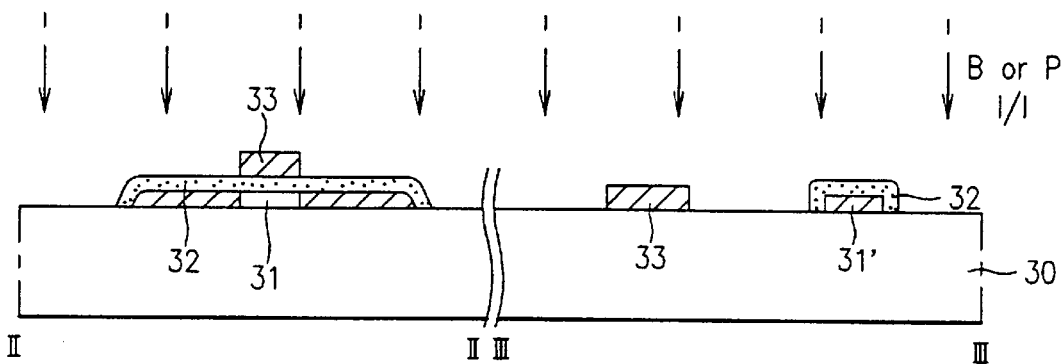

As illustrated in FIG. 5B, the first gate electrode material is deposited on the entire surface of the substrate 30 including the gate insulating film 32 and patterned to form the gate electrode 33. At this time, a polysilicon containing impurity ions such as boron or phosphorus is used as the first gate electrode material to facilitate the hydrogenation process in which hydrogen radicals are diffused into the active layer to improve performance of the thin film transistor. The source and drain regions are defined by implanting the impurity ions such as phosphorus or boron into the first active layer 31 using the gate electrode 33 as a mask. At this time, the impurity ions are naturally implanted into the second active layer 31' in which the storage capacitor will be formed, so that the lower electrode of the storage capacitor is defined.

The impurity ions implanted into the first and second active layers 31 and 31' are activated by heat treatment.

Figure 5C:
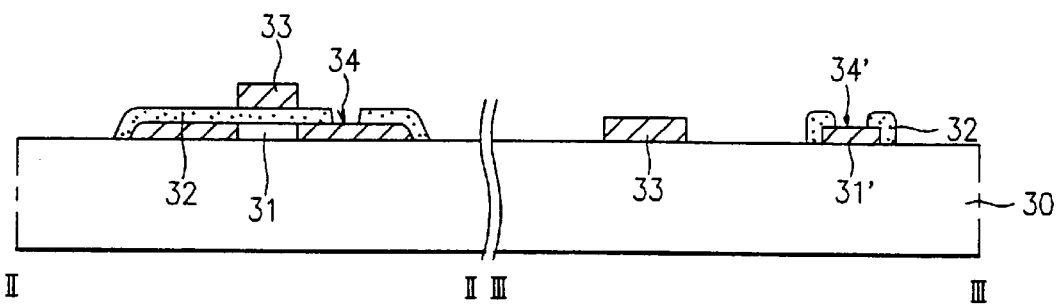

Subsequently, as illustrated in FIG. 5C, the gate insulating film 32 on the drain region of the first active layer 31 and on the second active layer 31' in which the storage capacitor will be formed is partially removed to form first and second contact holes 34 and 34', respectively.

Figure 5D:
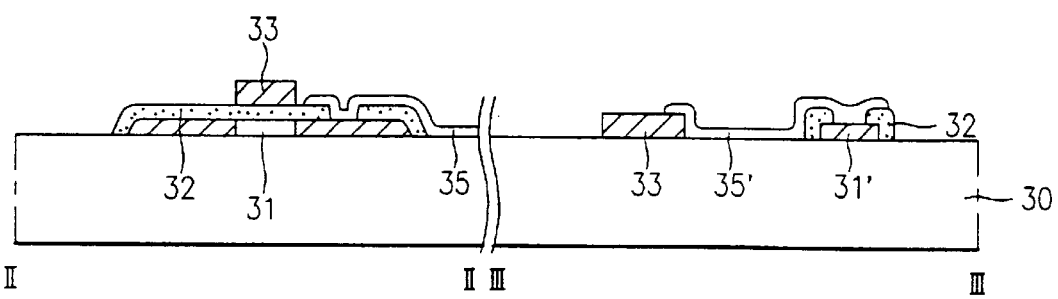

As illustrated in FIG. 5D, a transparent conductive material such as ITO is coated on the second active layer 31' and patterned. The first pixel electrode 35 is then formed to be connected with the drain region of the first active layer 31 through the first contact hole 34. At this time, the contact electrode 35' is formed to be connected with the second active layer 31', in which the storage capacitor will be formed, through the second contact hole 34' and at the same time to be connected with the gate electrode 33.

Figure 5E:
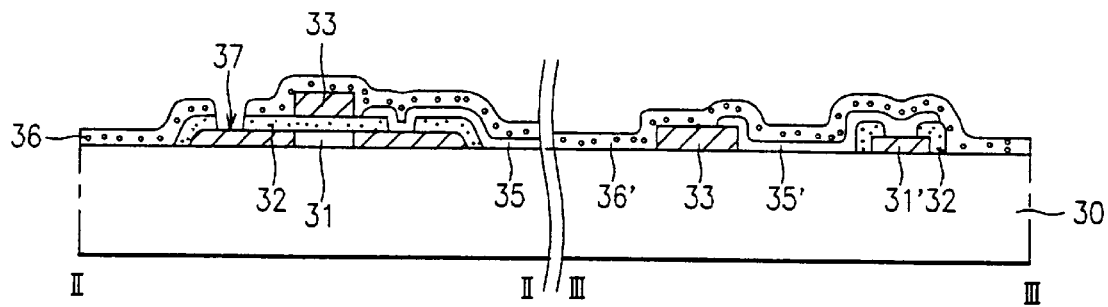

As illustrated in FIG. 5E, a first interlayer insulating film 36 is deposited on the entire surface of the substrate 30 including the first pixel electrode 35 and the contact electrode 35'. A third contact hole 37 is formed by selectively removing the gate insulating film 32 and the first interlayer insulating film 36 to expose the source region of the first active layer 31.

Figure 5F:
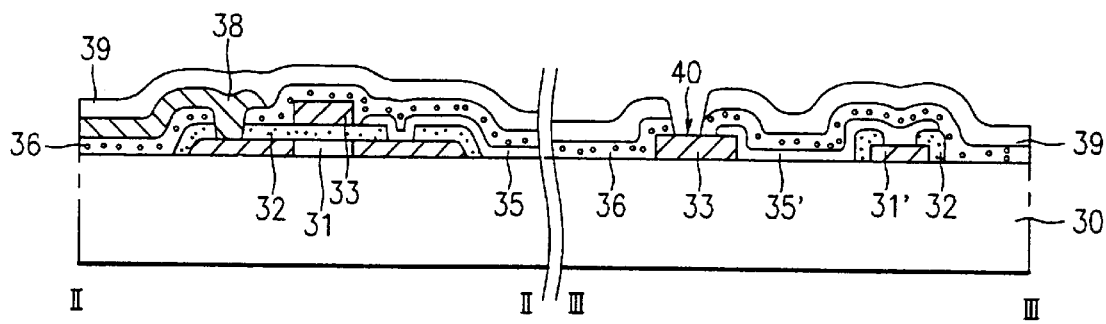

As illustrated in FIG. 5F, a metal is deposited on the entire surface of the substrate 30 including the first interlayer insulating film 36 and patterned. The data line 38 is then formed to be connected with the first active layer 31 through the third contact hole 37.

Subsequently, a second interlayer insulating film 39 is deposited on the entire surface of the substrate 30 including the data line 38. A fourth contact hole 40 is formed by selectively removing the first and second interlayer insulating films 36 and 39 to expose the gate electrode 33.

Figure 5G:
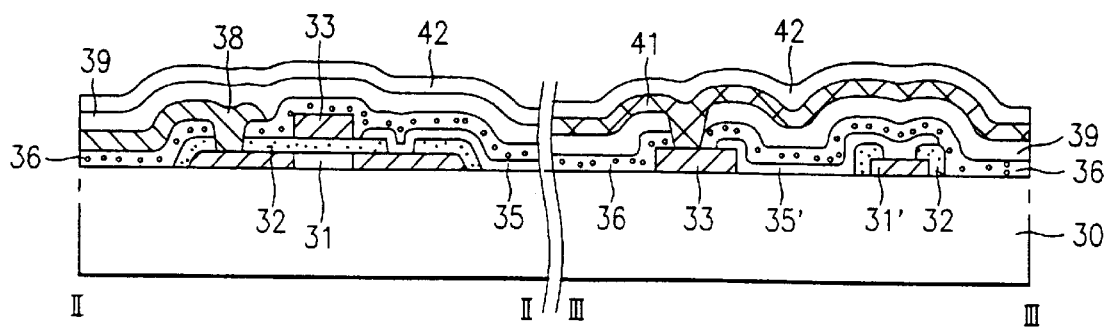

As illustrated in FIG. 5G, the second gate electrode material is deposited on the entire surface of the substrate 30 including the second interlayer insulating film 39 and patterned. The gate line 41 is then formed to be connected with the gate electrode 33 through the fourth contact hole 40. At this time, metal material having very low resistance is used as the gate line 41.

Thereafter, the first and second active layers 31 and 31' are hydrogenated to remove their defects and improve performance of the thin film transistor. A protective film 42 is formed on the entire surface of the substrate 30 including the gate line 41.

A liquid crystal display device according to a second embodiment of the present invention will now be described.

Figure 6:
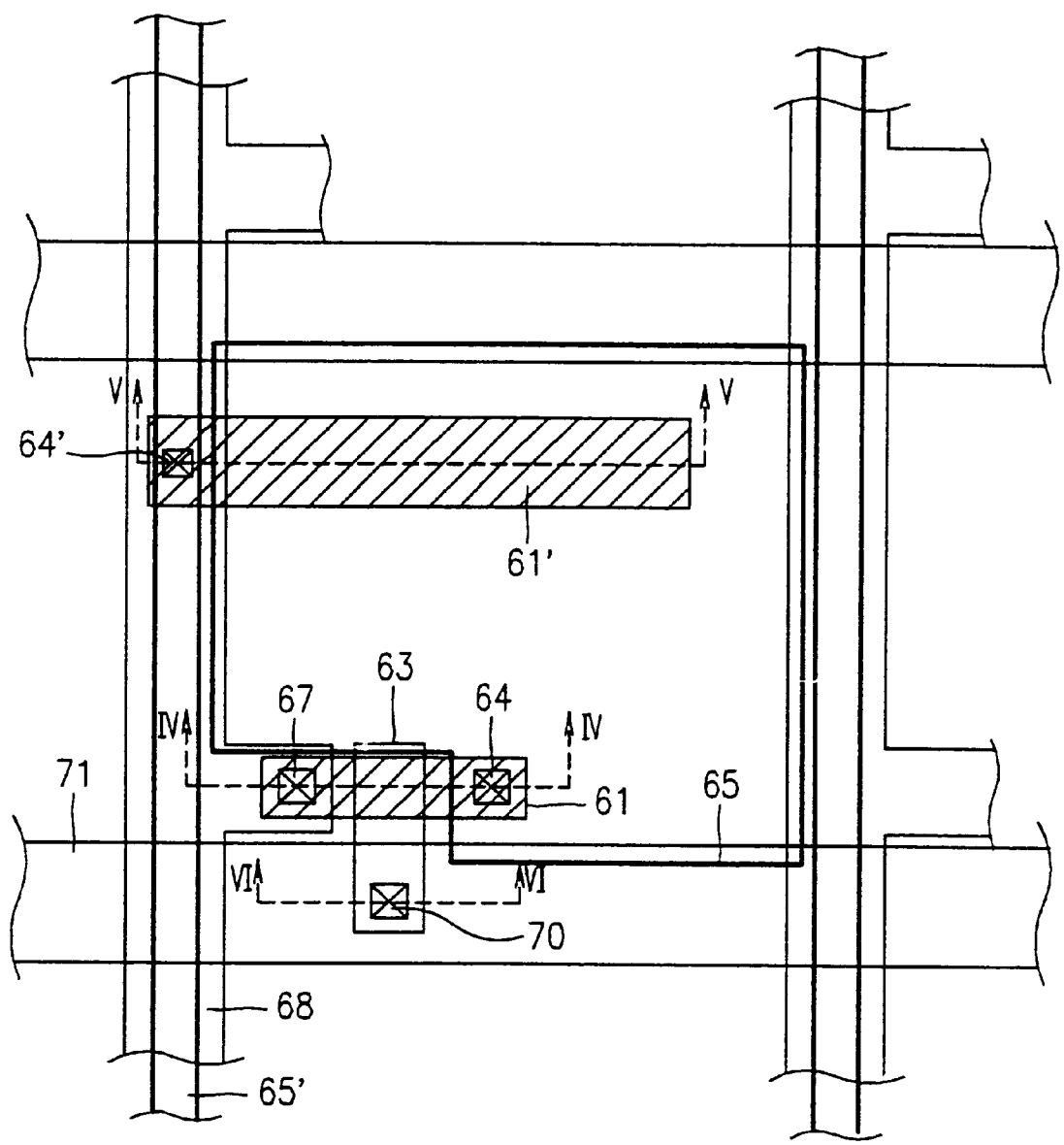

As illustrated in FIG. 6, a plurality of gate lines 71 are formed at a predetermined interval, and a plurality of data lines 68 are formed in a direction perpendicular to the gate lines 71 at a predetermined interval.

An island shaped first active layer 61 having source and drain regions is formed in a thin film transistor region on a substrate in which the gate lines 71 and the data lines 68 are formed. An island shaped second active layer 61' is formed in a storage capacitor region on the substrate.

A gate electrode 63 is formed between the source and drain regions of the first active layer 61 in contact with the gate line 71. At this time, the gate electrode 63 and the gate line 71 are made of different material from each other.

Subsequently, a first pixel electrode 65 is formed in a pixel region in contact with the drain region of the first active layer 61. A contact electrode 65' is formed in a data region in an integral form in contact with the second active layer 61'.

A method for fabricating the aforementioned liquid crystal display device according to the second embodiment of the present invention will be described below.

Figure 7A:
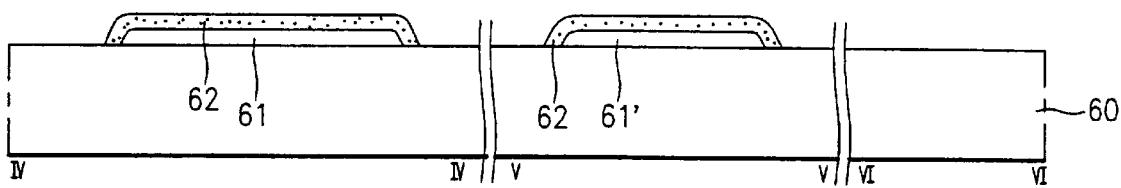

As illustrated in FIG. 7A, the first active layer 61 is formed in the thin film transistor region on a transparent insulating substrate 60 of glass or quartz and then patterned in an island shape. The second active layer 61' is formed in a region, in which the storage capacitor will be formed, and patterned in an island shape. The gate insulating film 62 is formed on the entire surface on the first and second active layers 61 and 61'.

Figure 7B:
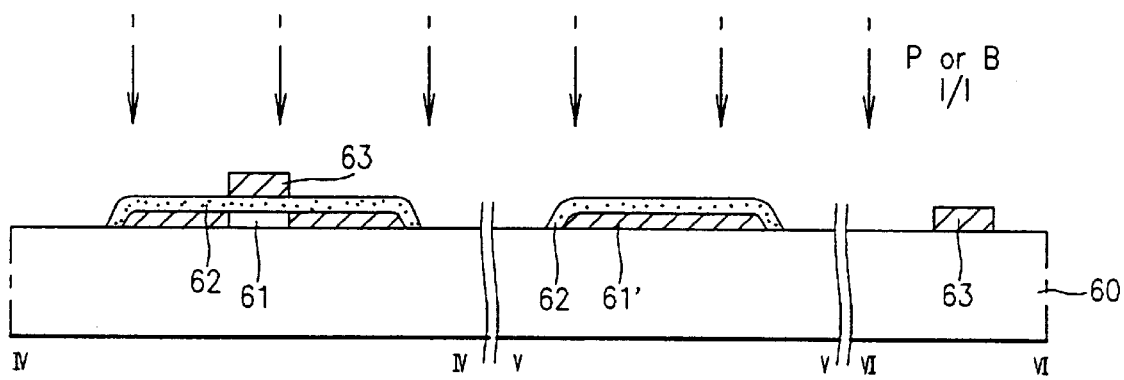

As illustrated in FIG. 7B, the first gate electrode material is deposited on the entire surface of the substrate 60 including the gate insulating film 62 and patterned to form the gate electrode 63. At this time, polysilicon containing impurity ions such as boron or phosphorus is used as the first gate electrode material to facilitate hydrogenation process.

The source and drain regions are defined by implanting impurity ions such as phosphorus or boron into the first active layer 61 using the gate electrode 63 as a mask. At this time, the impurity ions are naturally implanted into the second active layer 61' so that a lower electrode of the storage capacitor is defined.

Figure 7C:
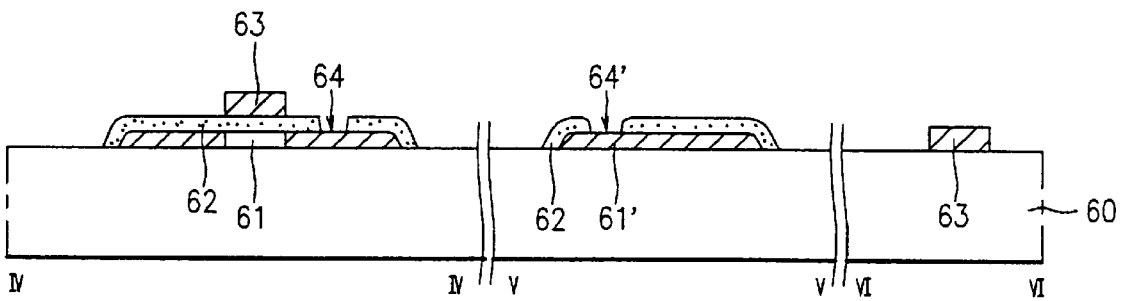

Subsequently, as illustrated in FIG. 7C, the gate insulating film 62 on the drain region of the first active layer 61 and on the second active layer 61' in which the storage capacitor will be formed is partially removed to form first and second contact holes 64 and 64', respectively.

Figure 7D:
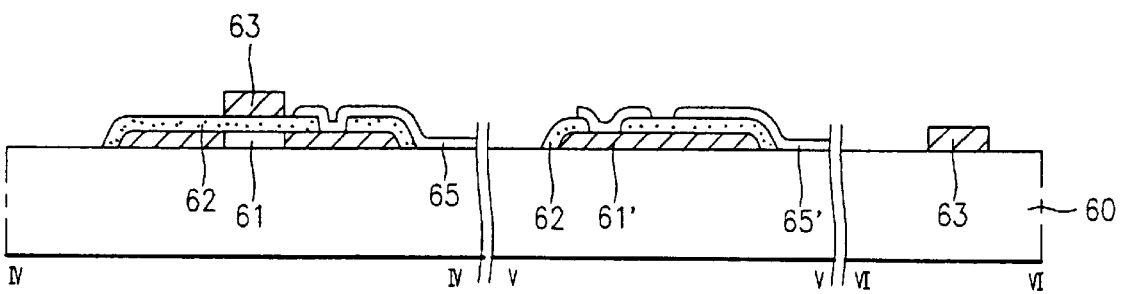

As illustrated in FIG. 7D, a transparent conductive material such as ITO is deposited and patterned. The first pixel electrode 65 is then formed to be connected with the drain region of the first active layer 61 through the first contact hole 64. At the same time, the contact electrode 65' is formed to be connected with the second active layer 61', in which the storage capacitor will be formed, through the second contact hole 64'.

Figure 7E:
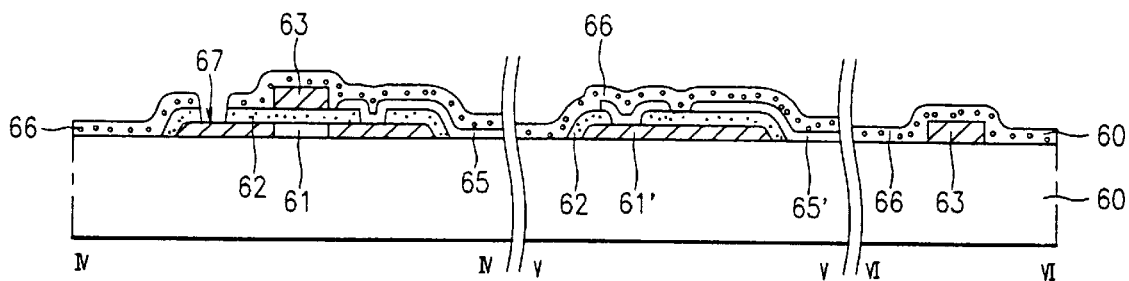

As illustrated in FIG. 7E, a first interlayer insulating film 66 is deposited on the entire surface of the substrate 60 including the first pixel electrode 65 and the contact electrode 65'. A third contact hole 67 is formed by selectively removing the gate insulating film 62 and the first interlayer insulating film 66 to expose the source region of the first active layer 61.

Figure 7F:
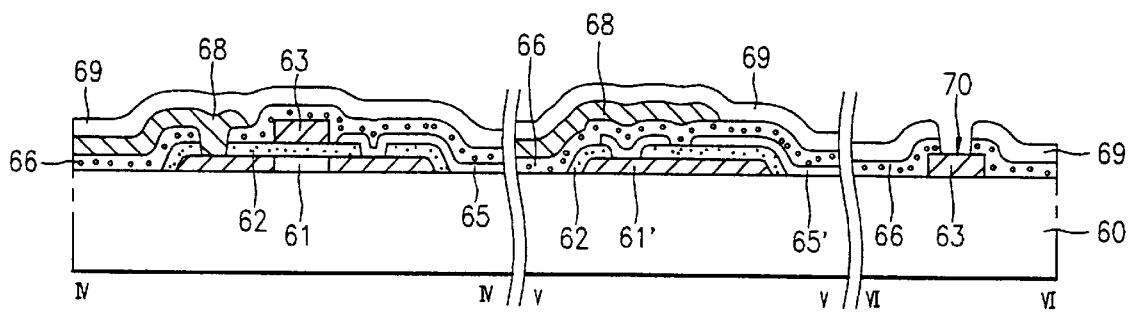

As illustrated in FIG. 7F, a metal is deposited on the entire surface of the substrate 60 including the first interlayer insulating film 66 and patterned. The data line 68 is then formed to be connected with the first active layer 61 through the third contact hole 67.

Subsequently, a second interlayer insulating film 69 is deposited on the entire surface of the substrate 60 including the data line 68. A fourth contact hole 70 is formed by selectively removing the first and second interlayer insulating films 66 and 69 to expose the gate electrode 63.

Figure 7G:
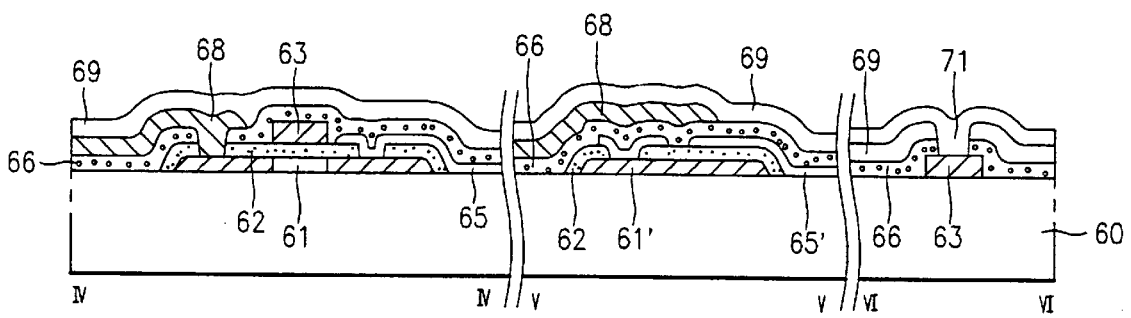

As illustrated in FIG. 7G, the second gate electrode material is deposited on the entire surface of the substrate 60 including the second interlayer insulating film 69 and patterned. The gate line 71 is then formed to be connected with the gate electrode 63 through the fourth contact hole 70. At this time, a metal material having very low resistance is used as the gate line 71.

Figure 7H:
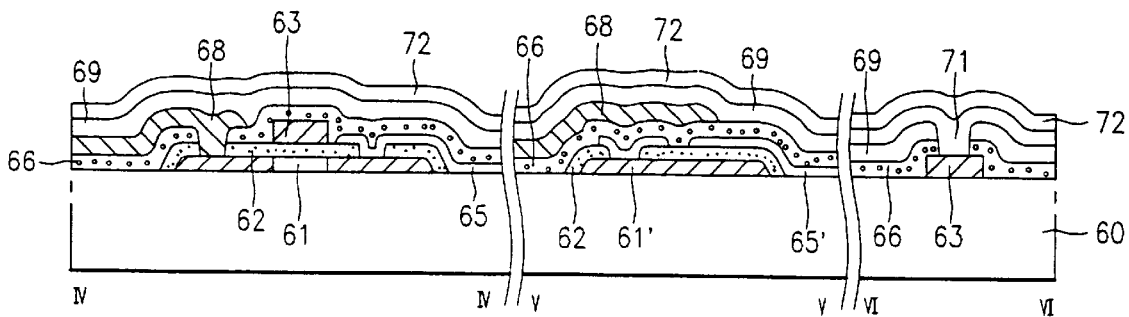

Thereafter, as illustrated in FIG. 7H, the first and second active layers 61 and 61' are hydrogenated to remove their defects and improve performance of the thin film transistor. A protective film 72 is formed on the entire surface of the substrate 60 including the gate line 71.

As aforementioned, the liquid crystal display device and the method for fabricating the same according to the present invention have the following advantages.

First, since the storage capacitor has a transparent structure formed of the active layer, the gate insulating film, and the pixel electrode, aperture is improved, thereby yielding a liquid crystal display device having high definition.

Second, since polysilicon containing the impurity ions is used as the gate electrode of the thin film transistor and metal material having very low resistance is used as the gate line, the resistance of the gate line is significantly reduced, thereby yielding a liquid crystal display device can have high density and high definition.

Third, since polysilicon is used as the gate electrode of the thin film transistor, hydrogen ions are vertically diffused through the gate electrode to facilitate hydrogenation process.

Finally, the lower electrode of the storage capacitor is defined when the source and drain regions of the thin film transistor are defined. Thus, it is possible to fabricate a device having excellent performance characteristics.

It will be apparent to those skilled in the art that various modifications and variations can be made in the liquid crystal display device and the method for fabricating the same according to the present invention without departing from the spirit or scope of the invention. Thus, it is intended that the present invention cover the modifications and variations of the invention provided they come within the scope of the appended claims and their equivalents.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A liquid crystal display device having a plurality of matrix shaped pixel regions approximately defined by a plurality of gate lines and data lines, comprising:

a first active layer coupled to a first pixel electrode in a first pixel region on a substrate;

a second active layer in a second pixel region of the substrate, wherein said first and second pixel regions are on opposite sides of one of said gate lines;

a gate electrode electrically coupled to said first active layer and said one of the gate lines; and a contact electrode for electrically coupling said gate electrode to said second active layer.

2. The device as claimed in claim 1, wherein said contact electrode is disposed below said one of the gate lines.

3. The device as claimed in claim 1, wherein said first active layer is in a first region on the substrate and includes a source region and a drain region and said second active layer is in a second region on the substrate.

4. The device as claimed in claim 3, wherein said gate electrode is formed between the source region and the drain region of said first active layer.

5. The device as claimed in claim 3, wherein said first pixel electrode contacts the drain region of said first active layer.

6. The device as claimed in claim 3, wherein said first region comprises a thin film transistor region and said second region comprises a storage capacitor region.

7. The device as claimed in claim 1, wherein said gate electrode and said one of the plurality of gate lines comprise different materials.

8. The device as claimed in claim 1, wherein said gate electrode comprises polysilicon and said one of the plurality of gate lines comprises metal.

9. The device as claimed in claim 1, wherein said plurality of gate lines and data lines are approximately perpendicular to each other and define approximately rectangular pixel regions.

10. The device as claimed in claim 1, wherein said plurality of gate lines and data lines are approximately perpendicular to each other and define approximately square pixel regions.

11. A liquid crystal display device having a plurality of matrix shaped pixel regions, and a plurality of gate lines and data lines between the pixel regions, the device comprising:

a first active layer having source and drain regions in a first region on a substrate; a second active layer in a second region on the substrate;

a gate electrode formed between the source region and drain regions of the first active layer in contact with one of said plurality of gate lines;

a first pixel electrode formed in the pixel regions in contact with the drain region of the first active layer; and a contact electrode formed to be connected with the gate electrode in contact with the second active layer.

12. The device as claimed in claim 11, wherein the first region comprises a thin film transistor region and the second region comprises a storage capacitor region.

13. The device as claimed in claim 11, wherein the gate electrode and the gate line comprise different materials from each other.

14. The device as claimed in claim 11, wherein the contact electrode is disposed below said one of the gate lines.

15. The device as claimed in claim 1, wherein the contact electrode overlaps said one of the gate lines.

16. A liquid crystal display device having a plurality of matrix shaped pixel regions, and gate lines and data lines perpendicular to each other between the pixel regions, the device comprising:

a first active layer having source and drain regions in a first region on a substrate;

a second active layer in a second region on the substrate;

a gate electrode formed between the source and drain regions of the first active layer in contact with gate lines;

a first pixel electrode formed in the pixel regions in contact with the drain region of the first active layer; and a contact electrode formed in a data line region in contact with the second active layer.

17. The device as claimed in claim 16, wherein the first region is a thin film transistor region and the second region is a storage capacitor region.

18. The device as claimed in claim 16, wherein the contact electrode overlaps the data lines and is formed in the same direction as the data line.

19. The device as claimed in claim 16, wherein the contact electrode is disposed below the data line.

20. The liquid crystal display device as claimed in claim 16, wherein the gate electrode and the gate line are formed of different material from each other.

* * * * *